(12) United States Patent
Wang et al.

(10) Patent No.: US 8,502,613 B2
(45) Date of Patent: *Aug. 6, 2013

(54) OSCILLATING CIRCUIT

(75) Inventors: Ping-Ying Wang, Hsinchu (TW); Hsiang-Hui Chang, Taipei Hsien (TW)

(73) Assignee: Mediatek Inc., Hsin-Chu (TW)

( * ) Notice: Subject to any disclaimer, the term of this patent is extended or adjusted under 35 U.S.C. 154(b) by 93 days.

This patent is subject to a terminal disclaimer.

(21) Appl. No.: 13/170,860

(22) Filed: Jun. 28, 2011

(65) Prior Publication Data

US 2011/0254635 A1  Oct. 20, 2011

Related U.S. Application Data

(63) Continuation of application No. 12/404,384, filed on Mar. 16, 2009, now Pat. No. 8,031,025.

(51) Int. Cl.
*H03L 7/085* (2006.01)
*H03C 3/22* (2006.01)

(52) U.S. Cl.
USPC ........ 331/177 V; 331/1 A; 331/17; 331/36 C; 375/376

(58) Field of Classification Search
USPC ............... 327/147, 156; 331/1 A, 16, 17, 34, 331/36 C, 177 V; 375/376
See application file for complete search history.

(56) References Cited

U.S. PATENT DOCUMENTS

| | | | |
|---|---|---|---|
| 6,208,211 B1 | 3/2001 | Zipper et al. | |
| 6,606,004 B2 | 8/2003 | Staszewski et al. | |
| 7,002,415 B2 | 2/2006 | Tsyrganovich | |
| 7,046,098 B2 | 5/2006 | Staszewski | |
| 7,091,795 B1 | 8/2006 | Tsyrganovich | |
| 7,573,347 B2* | 8/2009 | Mayer et al. | 331/179 |
| 7,605,664 B2* | 10/2009 | Sandner et al. | 331/16 |
| 7,692,500 B1* | 4/2010 | Koukab et al. | 331/17 |
| 7,719,369 B2 | 5/2010 | Kamath et al. | |
| 7,750,701 B2 | 7/2010 | Ainspan et al. | |
| 7,786,913 B2* | 8/2010 | Waheed et al. | 341/143 |
| 7,791,417 B2* | 9/2010 | Wang et al. | 331/25 |
| 8,031,025 B2* | 10/2011 | Wang et al. | 331/177 V |
| 2003/0107442 A1 | 6/2003 | Staszewski | |
| 2009/0085672 A1 | 4/2009 | Ikeda et al. | |
| 2009/0097609 A1 | 4/2009 | Chang et al. | |
| 2009/0243740 A1 | 10/2009 | Rofougaran | |
| 2010/0097110 A1* | 4/2010 | Kearney et al. | 327/156 |

FOREIGN PATENT DOCUMENTS

TW   200721686   6/2007

OTHER PUBLICATIONS

Staszewski, R.B., et al.; "All-Digital PLL and Transmitter for Mobile Phones;" IEEE Journal of Solid-State Circuits; vol. 40; No. 12; Dec. 2005; pp. 2469-2482.

* cited by examiner

*Primary Examiner* — Levi Gannon

(74) *Attorney, Agent, or Firm* — McClure, Qualey & Rodack, LLP

(57) ABSTRACT

An oscillating circuit including a digital sigma-delta modulator and a controlled oscillator is disclosed. The digital sigma-delta modulator receives a fractional bit signal to generate a control signal. The controlled oscillator includes a varactor dynamically coupled to receive the control signal.

19 Claims, 9 Drawing Sheets

OSCILLATING CIRCUIT

CROSS REFERENCE TO RELATED APPLICATIONS

This application is a Continuation of pending U.S. patent application Ser. No. 12/404,384, filed Mar. 16, 2009 and entitled "MIXED-MODE PLL", the entirety of which is incorporated by reference herein.

BACKGROUND OF THE INVENTION

1. Field of the Invention

The invention relates to an all digital phase locked loop (ADPLL) and, in particular, to a fractional spur reduction technique for an ADPLL.

2. Description of the Related Art

All digital phase locked loops (ADPLLs) have been reported to have superior performance with low cost. However, a fraction-N operation of an ADPLL induces high fractional spur as compared to a conventional charge pump-based fraction-N PLL, which is the most popular architecture used in wireless applications.

In a conventional delta-sigma fractional PLL, the fractional spur is induced by non-linearity of the loop such as charge pump current mismatch and clock feed-through. However, the induced fractional spur can be suppressed to zero by a passive low pass filter to make circuit design more robust. On the other hand, for an all-digital PLL (ADPLL) as shown in FIG. 1, non-linearity of the loop is induced by quantization errors/non-linearity/meta-stability of a time to digital converter (TDC) and a digital controlled oscillator (DCO). The spur induced by the non-linearity can not be filtered to zero by a digital low pass filter or a digital algorithm because the resolution of the digital loop filter is finite, which is limited by the quantization errors of the DCO. As a result, the fractional spurs exist in an ADPLL. Accordingly, if a DCO's quantization errors can be reduced, the resolution of the digital loop filter will be closer to that of an analog loop filter. Thus, the digital low pass filter and the digital algorithm would effectively be able to eliminate spurs.

To improve a DCO's resolution, a frequency dithering technique is recommended to obtain a higher resolution average frequency. Although the noise induced by the quantization error is reduced using this technique, this technique cannot eliminate the fractional spur. This is because the short-term DCO quantization error remains the output signal. This transient quantization error will be sampled into the loop and amplified by gain variation of the TDC. Additionally, it is impossible to achieve a low DCO quantization error since the required MOS capacitor geometry will be smaller than what an advanced process can provide.

FIG. 1 is a block diagram of a conventional TDC-based fractional-N ADPLL. The TDC converts phase error into a digital domain and then a digital loop filter processes that digital data. The output of the digital loop filter is transferred into a time domain by the DCO. Since quantization error of the output is determined by resolution of the DCO, not by the digital loop filter, a digital modulator is required to improve the average frequency resolution of the DCO.

FIG. 2 (FIGS. 2A and 2B) is a functional block diagram of a conventional DCO used in the conventional TDC-based fractional-N ADPLL shown in FIG. 1. The switching capacitor array in this DCO is used to digitally control the frequency of the LC oscillator. The capacitor array is separated into an integer part and a fractional part with the output signal device size. In order to eliminate non-monotonic DCO gain induced by device mismatch between the integer and fractional bits, the dynamic element match (DEM) technique is used. A high speed dithering signal generated by the SDM modulates the unit capacitor to achieve a higher DCO average frequency resolution, as shown in FIG. 3. The desired high resolution is achieved by toggling the DCO between frequencies f1 and f1+Δf. The frequency resolution with long-term average is smaller than the quantization error Δf, but the short-term quantization error still equals to Δf.

BRIEF SUMMARY OF THE INVENTION

An embodiment of an oscillating circuit comprises a digital sigma-delta modulator and a controlled oscillator. The digital sigma-delta modulator receives a fractional bit signal to generate a control signal. The controlled oscillator comprises a varactor dynamically coupled to receive the control signal.

An embodiment of a method for generating oscillating signals comprises performing sigma-delta modulation to a fractional bit signal to generate an control signal, controlling an output frequency of a controlled oscillator according to the control signal and performing thermal code decoding to an integer bit signal to generate a first output signal to control the output frequency of the controlled oscillator.

Another embodiment of a method for generating oscillating signals comprises performing sigma-delta modulation to a fractional bit signal to generate an control signal; and dynamically coupling the control signal to a varactor of a controlled oscillator so as to control an output frequency of the controlled oscillator.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
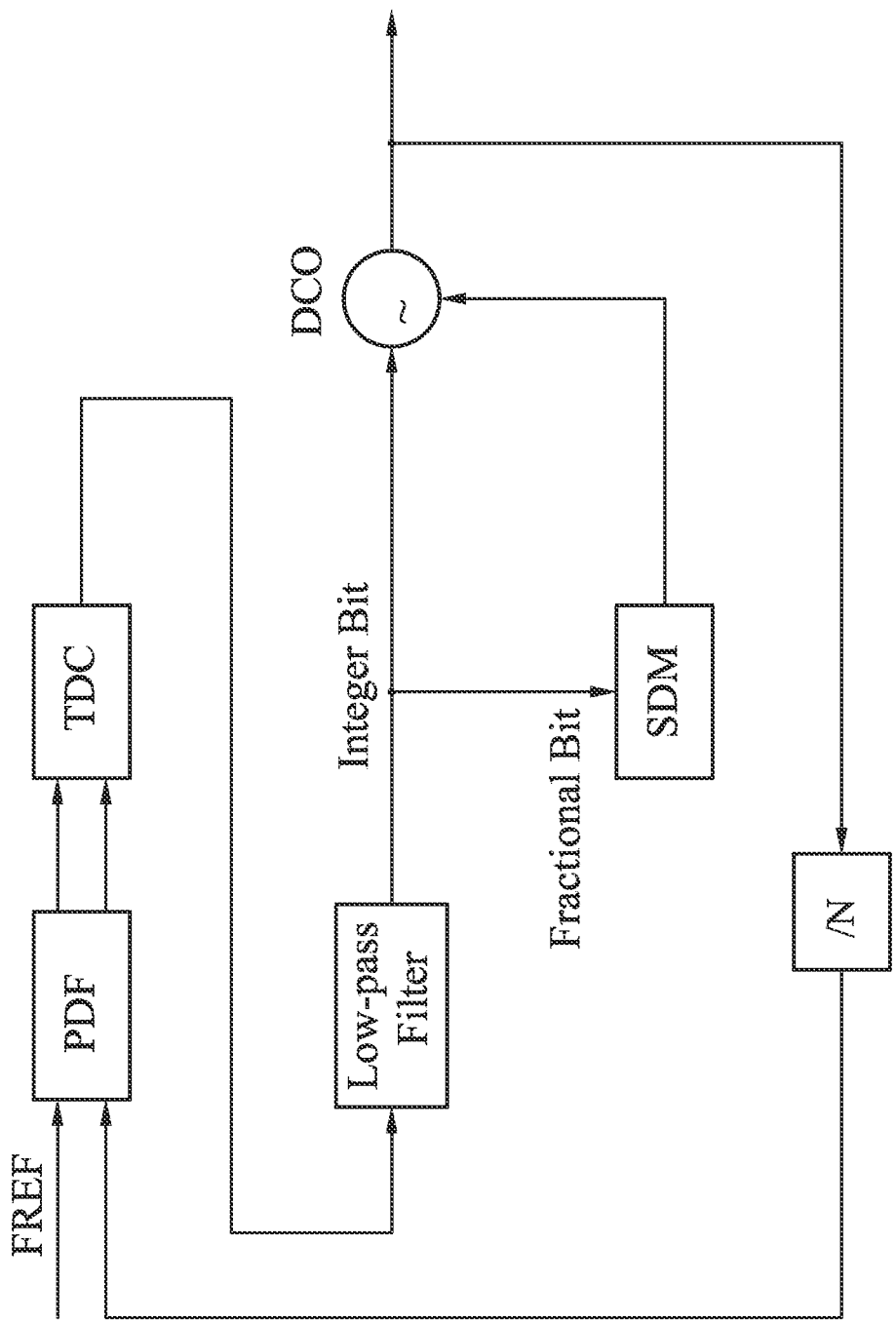
FIG. 1 is a block diagram of a conventional TDC-based fractional-N ADPLL.
Figure 2A:
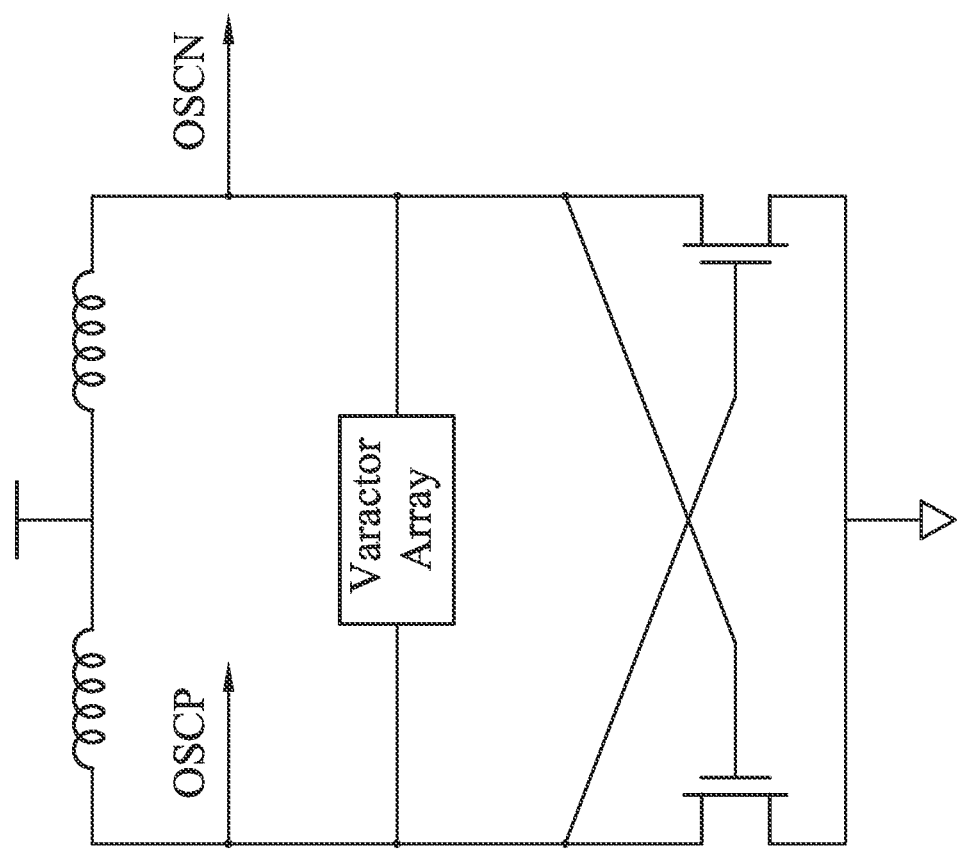
FIG. 2 (FIGS. 2A and 2B) is a functional block diagram of a conventional DCO used in the conventional TDC-based fractional-N ADPLL shown in FIG. 1.
Figure 2B:
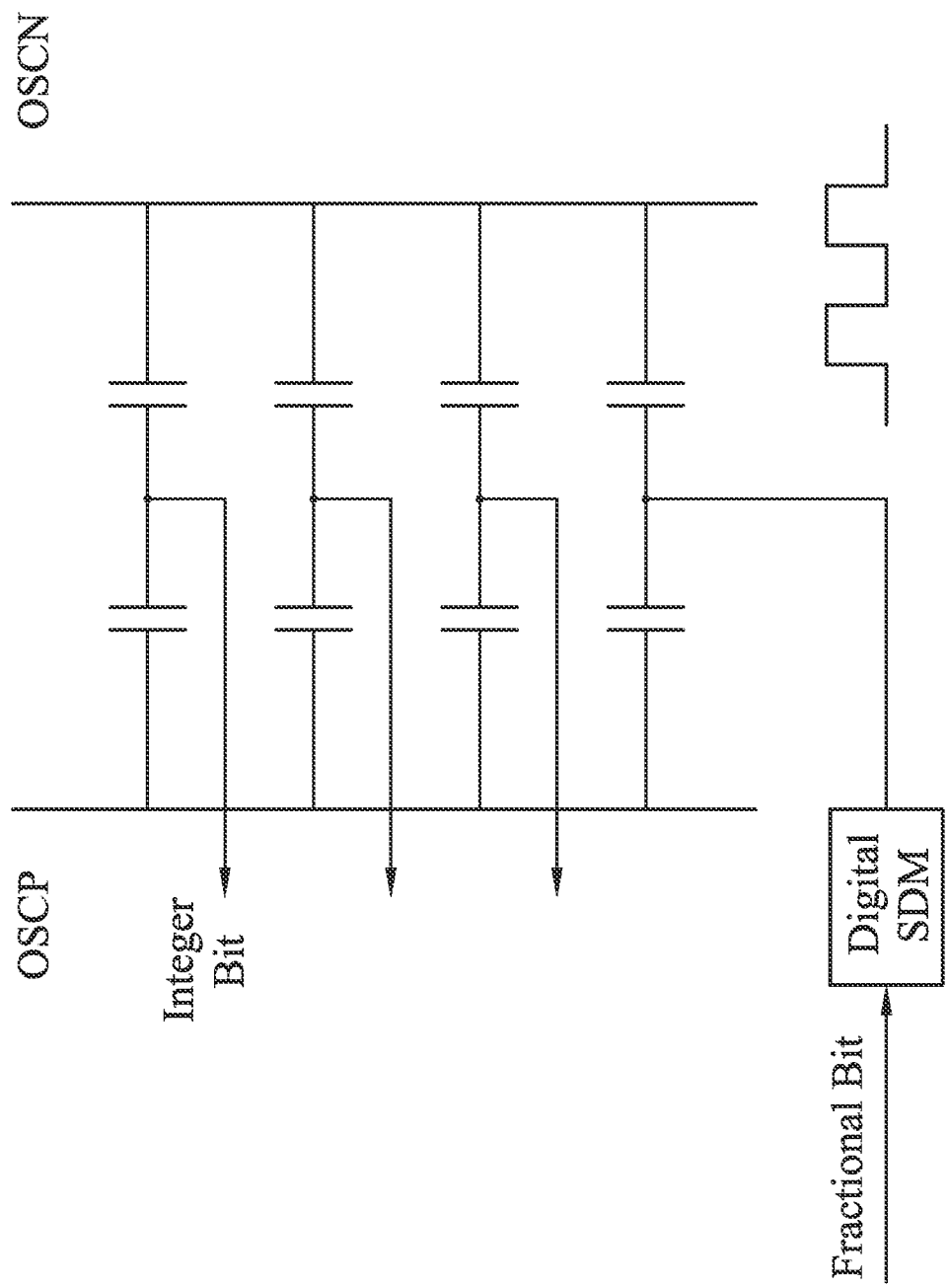
Figure 3:
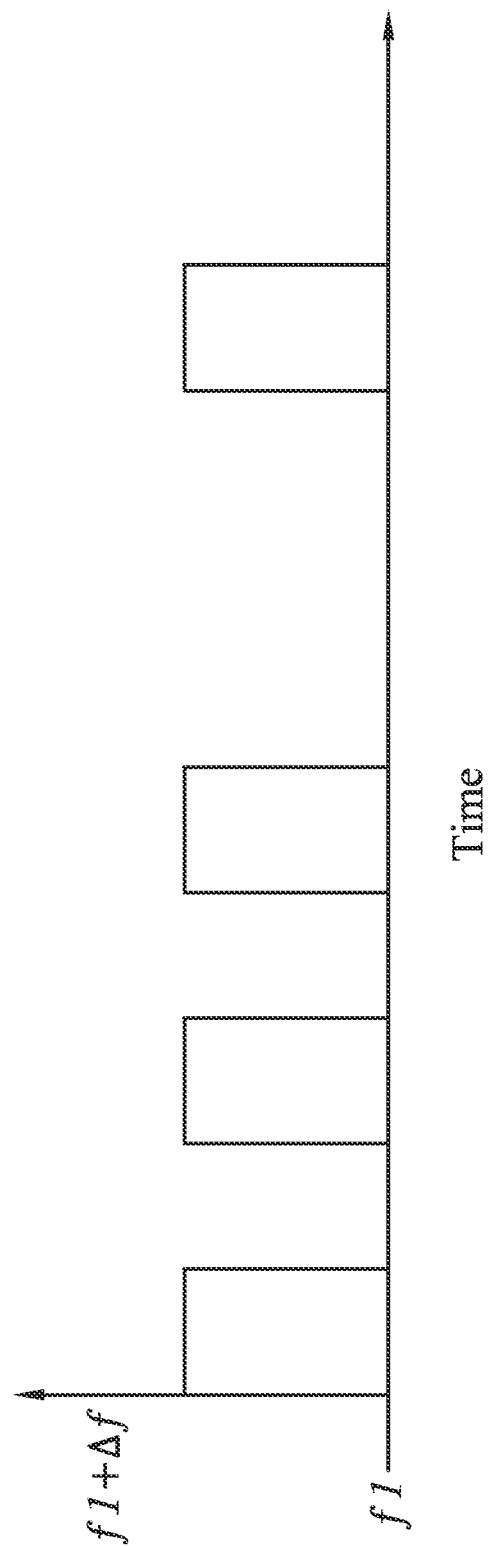
FIG. 3 is a diagram showing a conventional DCO having an output frequency toggling between two discrete levels.
Figure 4:
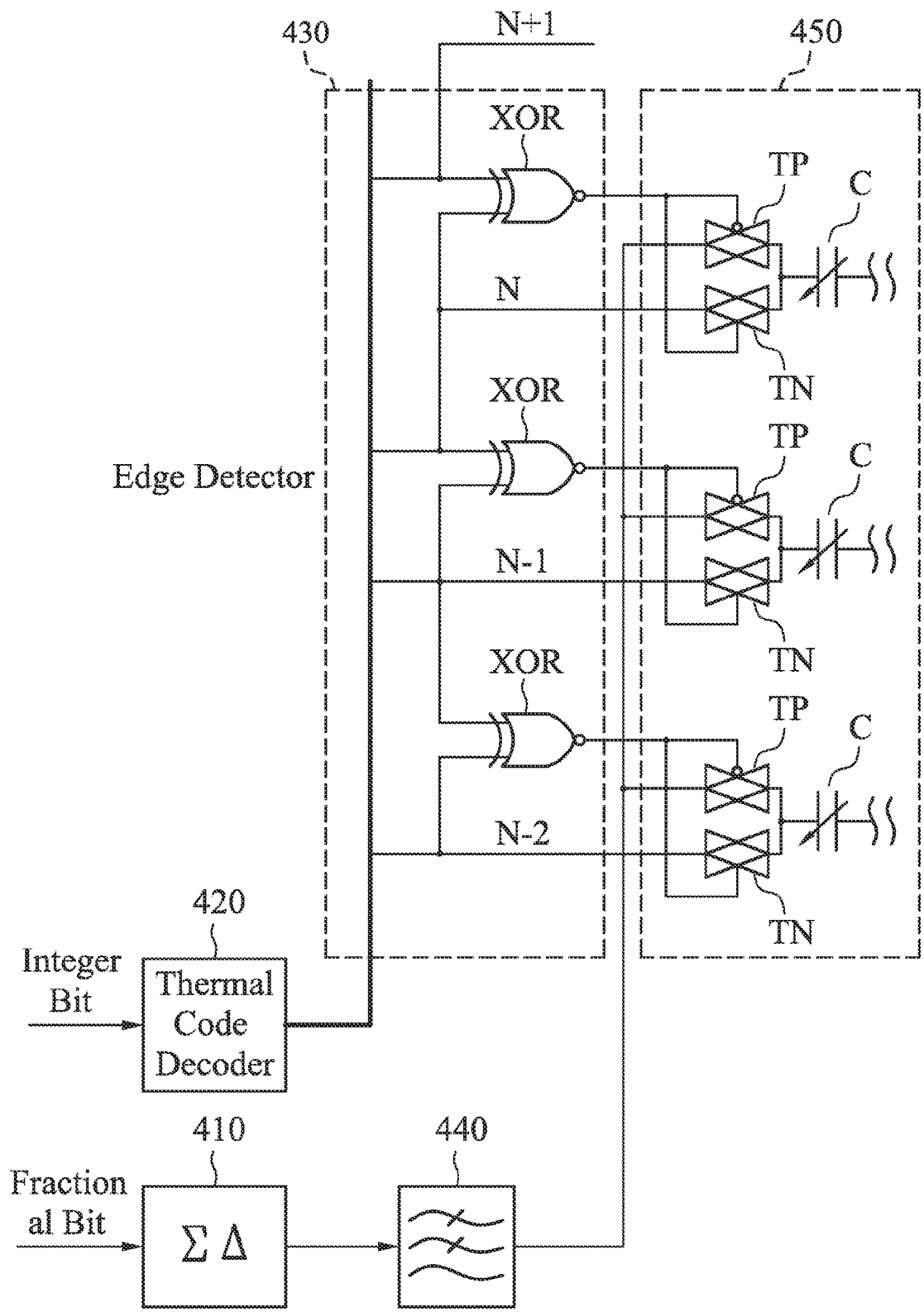
FIG. 4 is a schematic diagram showing part of a mixed-mode PLL according to an embodiment of the invention.

FIG. 4 is a schematic diagram showing part of a mixed-mode PLL according to an embodiment of the invention. In FIG. 4, the mixed-mode PLL comprises a digital sigma-delta modulator 410, a thermal code decoder 420, an edge detector 430, a low pass filter 440, and a digital controlled oscillator 450. The digital sigma-delta modulator 410 receives a fractional bit signal. The thermal decoder 420 receives a fractional bit signal. The low pass filter 440 is coupled to the digital sigma-delta modulator 410. The low pass filter 440 receives an output signal of the digital sigma-delta modulator 410 and converts the output signal to an analog control signal. The digital controlled oscillator 450 comprises a plurality of varactors C. Each of the varactors C is dynamically coupled to the low pass filter 440 and receives the analog control signal via a corresponding transmission gate TP. Each of the transmission gates TP is controlled by a corresponding XOR gate XOR in the edge detector 430. Each of the XOR gates XOR receives two adjacent bits (N/N+1, N−1/N, N−2/N−1 . . . ) from an output signal of the thermal code decoder 420. Via the XOR gates XOR, the edge detector 430 determines which varactor C is coupled to the low pass filter 440.

Figure 5A:
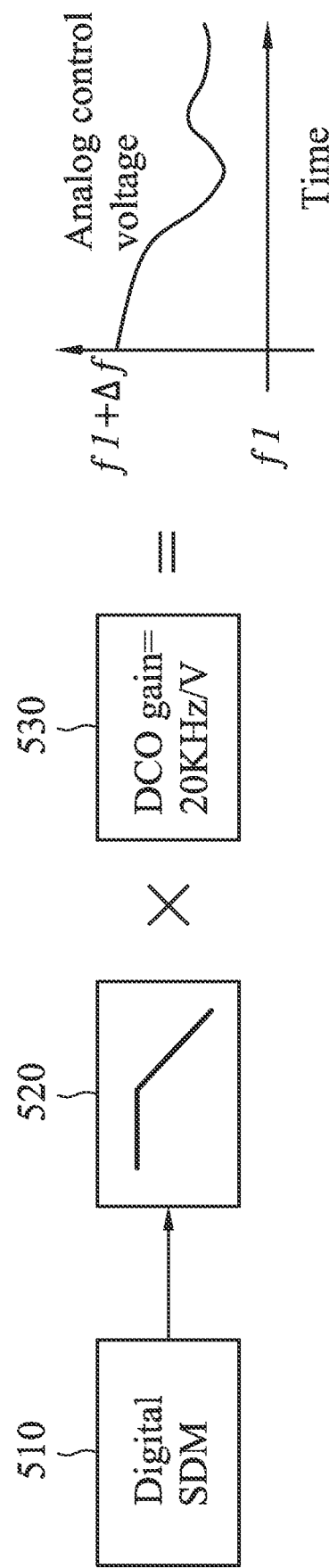
FIG. 5A is a schematic diagram showing a concept of the disclosed embodiment of the invention.
Figure 5B:
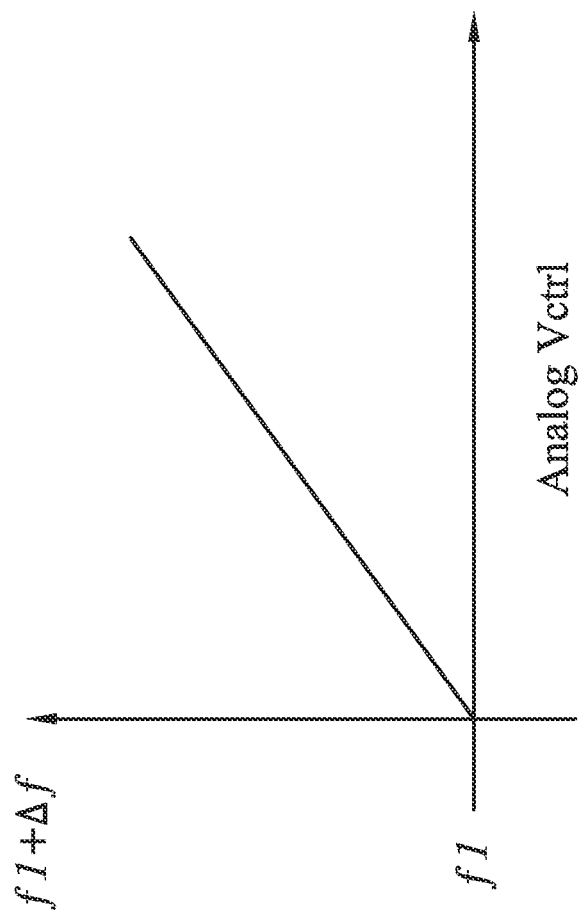
FIG. 5B is a schematic diagram showing characteristics of the DCO 530 shown in FIG. 5A.

FIG. 5A is a schematic diagram showing a concept of the disclosed embodiment of the invention. A passive low pass filter 520 is added at the output of the digital sigma-delta modulator 510 to filter the full-swing digital signal to become an analog control signal which controls the unit capacitor with 20 KHz/V VCO gain. The frequency variation is continuous as shown in FIG. 5A so the short-term quantization of the DCO 530 is eliminated. Although the digital nature of the dithering signal is converted into an analog domain, the DCO 530 still preserves its immunity against thermal, substrate and switching noise due to low gain 20 KHz/V which is only $1/1000$ of that of the conventional VCO used in an analog PLL. FIG. 5B is a schematic diagram showing characteristics of the DCO 530 shown in FIG. 5A.

The DEM technique can not be used because the analog signal in the fractional bit and the digital signal in the integer bit can not be exchanged digitally in this architecture. In order to eliminate non-monotonic frequency gain without using the DEM technique, the invention re-arranges the connection of the varactor bank as show in FIG. 4. The analog low pass filter 440 is shared with all varactors C and connected to one of the varactors C dynamically by edge decoder signal to reduce costs and phase noise induced by thermal noise of the resistor in the low pass filter 440. The edge detector 430 detects the transient bit of the thermal code and determines which varactor should be connected to the analog low pass filter 440 and serve as a fractional bit of the DCO 450. The thermal code decoder 420 is used to guarantee the monotonicity of the capacitance when the integer bit is toggled.

Since the output signal fractional bit is turned off or on to be the integer bit when fractional code overflows or underflows, there is no discontinuity of capacitance. The monotonicity of DCO is maintained to eliminate the possibility of noise and spur boosting due to positive feedback induced by non-monotonic frequency gain in the DCO.

Figure 6:
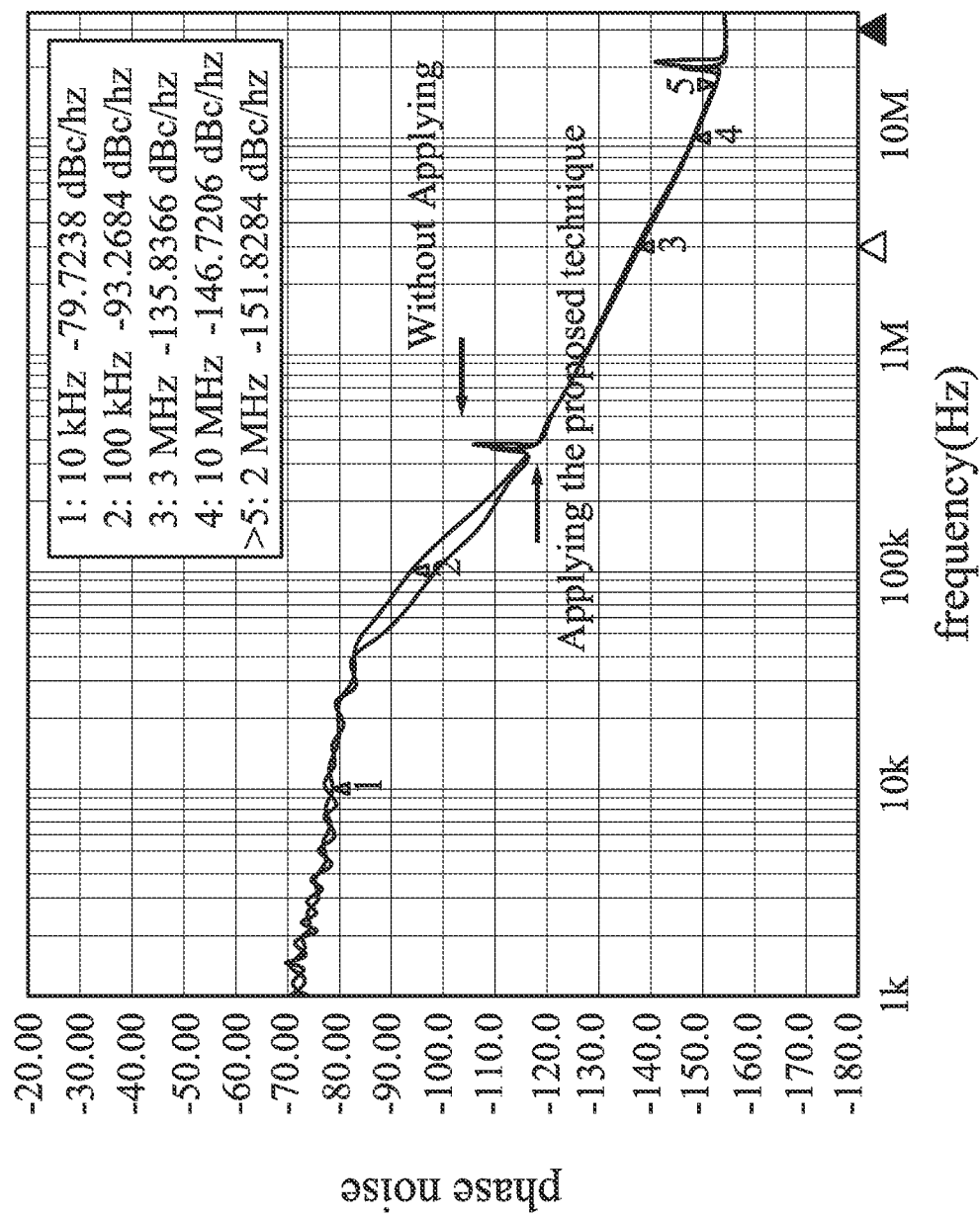
FIG. 6 shows measured phase noise with and without the disclosed embodiment of the invention.
Figure 7:
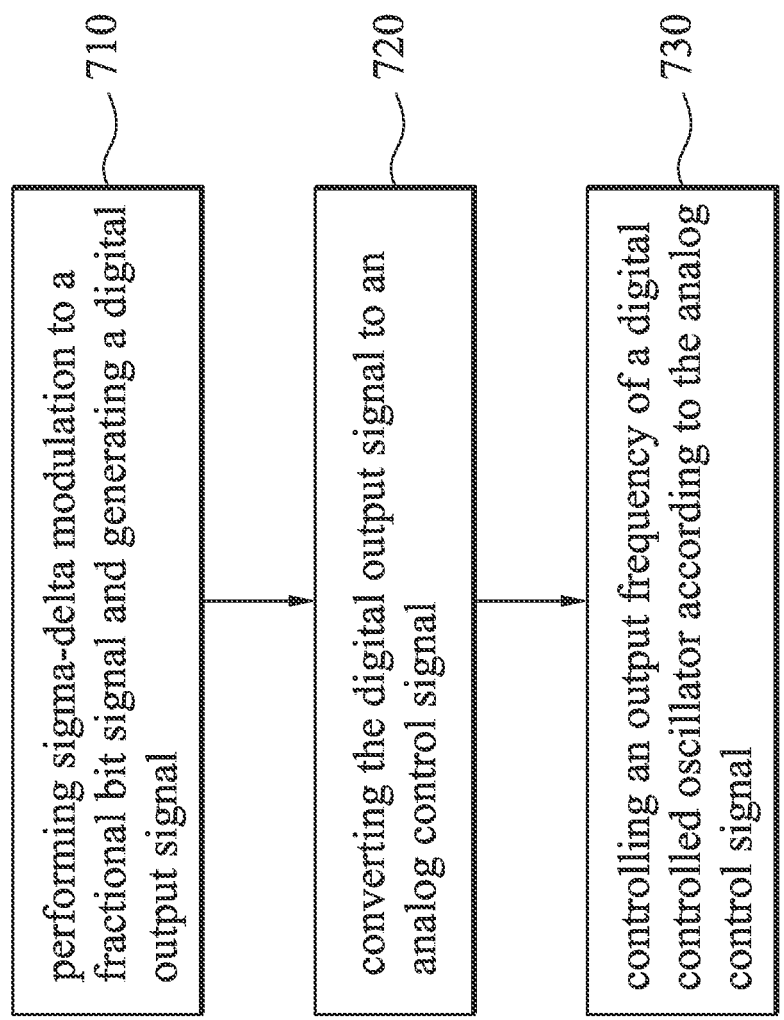
FIG. 7 is a method for reducing fractional spur of an ADPLL according to an embodiment of the invention.

The silicon prototype was implemented in 0.13 um CMOS technology. Measured phase noise with and without the proposed spur reduction technique is shown in FIG. 6. It shows that the fractional spur still exists even when a high order digital low-pass filter and a digital algorithm such as phase cancellation is applied. When our proposed technique is applied, the fractional spur is under a phase noise floor, implying a more than 9 dB spur reduction. The noise floor at 400 KHz is the output signal no matter if the spur reduction technique is applied or not. This means that the frequency dithering used in the conventional DCO indeed reduces phase noise but it cannot eliminate fractional spurs. Compared with the conventional DCO, the extra silicon area required for implementing the passive low-pass filter and MOS switches is only 0.02 mm$^2$ FIG. 7 is a method for reducing fractional spur of an ADPLL according to an embodiment of the invention. The method comprises performing sigma-delta modulation to a fractional bit signal and generating a digital output signal (step 710), converting the digital output signal to an analog control signal (step 720), and controlling an output frequency of a digital controlled oscillator according to the analog control signal (step 730).

The invention provides a spur reduction technique to eliminate the fractional spur by improving the short-term frequency resolution of a DCO. The technique only requires adding a simple analog low pass filter and rearranging switches in the DCO used in the conventional ADPLL.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An oscillating circuit, comprising:
a digital sigma-delta modulator receiving a fractional bit signal to generate a control signal; and
a controlled oscillator comprising a varactor dynamically coupled to receive the control signal, wherein the varactor is coupled to a thermal code decoder receiving an integer bit signal.

2. The oscillating circuit as claimed in claim 1, wherein the varactor is dynamically coupled to receive the control signal via a first transmission gate.

3. The oscillating circuit as claimed in claim 2, wherein the first transmission gate is controlled by a corresponding exclusive-or (XOR) gate in an edge detector.

4. The oscillating circuit as claimed in claim 3, wherein the exclusive- or (XOR) gate receives two adjacent bits from an output signal of the thermal code decoder.

5. The oscillating circuit as claimed in claim 4, wherein the varactor is dynamically coupled to receive one of the two adjacent bits via a second transmission gate.

6. The oscillating circuit as claimed in claim 5, wherein the first and the second transmission gates are controlled by the corresponding exclusive-or (XOR) gate in the edge detector.

7. The oscillating circuit as claimed in claim 6, wherein when the first transmission gate transmits the control signal to the varactor, the second transmission gate does not transmit one of the two adjacent bits to the varactor, and when the second transmission gate transmits one of the two adjacent bits to the varactor, the first transmission gate does not transmit the control signal to the varactor.

8. The oscillating circuit as claimed in claim 1, wherein the controlled oscillator is coupled to a thermal code decoder via an edge detector and an output signal of the edge detector determines whether the varactor is coupled to receive the control signal.

9. The oscillating circuit as claimed in claim 8, wherein the edge detector comprises an exclusive-or (XOR) gate receiving adjacent bits.

10. The oscillating circuit as claimed in claim 9, wherein when the varactor is not coupled to receive the control signal, the varactor receives one of the adjacent bits.

11. The oscillating circuit as claimed in claim 10, wherein the adjacent bits are generated by the thermal code decoder.

12. A method for generating oscillating signals, comprising:
- performing sigma-delta modulation to a fractional bit signal to generate a control signal;
- controlling an output frequency of a controlled oscillator according to the control signal; and
- performing thermal code decoding to an integer bit signal to generate a first output signal to control the output frequency of the controlled oscillator, wherein at least a portion of the first output signal is input into a logic gate to output a first control signal to the controlled oscillator.

13. The method as claimed in claim 12, wherein sigma-delta modulation is performed by a sigma-delta modulator.

14. The method as claimed in claim 12, wherein two adjacent bits of the first output signal are inputted into an exclusive-or (XOR) gate to output a first control signal to the controlled oscillator.

15. The method as claimed in claim 12, wherein the control signal is utilized to control the controlled oscillator to receive one of two adjacent bits or to receive the control signal.

16. A method for generating oscillating signals, comprising:
- performing sigma-delta modulation to a fractional bit signal to generate a control signal;
- dynamically coupling the control signal to a varactor of a controlled oscillator so as to control an output frequency of the controlled oscillator; and
- performing thermal code decoding to an integer bit signal to generate a first output signal to control the output frequency of the controlled oscillator.

17. The method as claimed in claim 16, wherein two adjacent bits of the first output signal are inputted into an exclusive-or (XOR) gate to output a first control signal to the controlled oscillator.

18. The method as claimed in claim 17, wherein the first control signal is utilized to control the controlled oscillator such that the varactor receives the control signal or one of the two adjacent bits.

19. The method as claimed in claim 16, wherein sigma-delta modulation is performed by a sigma-delta modulator.

* * * * *